US012740323B2

(12) United States Patent
Kobayashi et al.

(10) Patent No.: US 12,740,323 B2
(45) Date of Patent: Sep. 15, 2026

(54) PIEZOELECTRIC LAMINATE, PIEZOELECTRIC ELEMENT, AND MANUFACTURING METHOD FOR PIEZOELECTRIC LAMINATE

(71) Applicant: FUJIFILM Corporation, Tokyo (JP)

(72) Inventors: Hiroyuki Kobayashi, Kanagawa (JP); Fumihiko Mochizuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 932 days.

(21) Appl. No.: 18/053,247

(22) Filed: Nov. 7, 2022

(65) Prior Publication Data

US 2023/0144847 A1 May 11, 2023

(30) Foreign Application Priority Data

Nov. 9, 2021 (JP) ................................. 2021-182843

(51) Int. Cl.
*H10N 30/072* (2023.01)
*H10N 30/85* (2023.01)

(52) U.S. Cl.
CPC ......... *H10N 30/072* (2023.02); *H10N 30/852* (2023.02)

(58) Field of Classification Search
CPC .. H10N 30/072; H10N 30/852; H10N 30/076; H10N 30/708; H10N 30/8554; H10N 30/877
See application file for complete search history.

(56) References Cited

U.S. PATENT DOCUMENTS

2004/0232804 A1* 11/2004 Kita ..................... H10N 30/704 310/358
2010/0073435 A1* 3/2010 Miyazawa ........... B41J 2/04581 347/71

(Continued)

FOREIGN PATENT DOCUMENTS

EP 1 677 367 A1 7/2006
JP 2003-81694 A 3/2003

(Continued)

OTHER PUBLICATIONS

Translation of KR-20050076654-A (Year: 2005).*

(Continued)

*Primary Examiner* — Jeffrey T Carley
(74) *Attorney, Agent, or Firm* — Birch, Stewart, Kolasch & Birch, LLP

(57) ABSTRACT

There is provided a piezoelectric laminate has, on a substrate in the following order, a lower electrode layer and a piezoelectric film containing a perovskite-type oxide as a main component. The piezoelectric film has an oxygen-deficient region in a region in contact with the lower electrode layer. In a case where an average value of oxygen amounts in a region centrally located among three regions obtained by dividing the piezoelectric film into three equal parts in a thickness direction is denoted as a first average oxygen amount, and an average value of oxygen amounts in the oxygen-deficient region is denoted as a second average oxygen amount, a ratio R of the second average oxygen amount to the first average oxygen amount is less than 0.97. A thickness of the oxygen-deficient region is 120 nm or more and is ⅓ or less of a thickness of the entire piezoelectric film.

9 Claims, 4 Drawing Sheets

(56) References Cited

U.S. PATENT DOCUMENTS

| | | | | |
|---|---|---|---|---|
| 2010/0208007 | A1* | 8/2010 | Nihei | H10N 30/06 29/25.35 |
| 2011/0086289 | A1* | 4/2011 | Venkataraman | H01M 8/1246 429/495 |
| 2012/0182358 | A1* | 7/2012 | Miyazawa | B41J 2/14233 347/68 |
| 2014/0042875 | A1* | 2/2014 | Suenaga | H10N 30/04 29/25.35 |
| 2018/0170044 | A1* | 6/2018 | Mawatari | B41J 2/1631 |

FOREIGN PATENT DOCUMENTS

| | | | | |
|---|---|---|---|---|
| JP | 2009-49220 A | | 3/2009 | |
| JP | 2017-28062 A | | 2/2017 | |
| JP | 2017-59751 A | | 3/2017 | |
| JP | 2019-52348 A | | 4/2019 | |
| KR | 20050076654 A | * | 7/2005 | C23C 18/1216 |
| WO | WO 2015/045845 A1 | | 4/2015 | |

OTHER PUBLICATIONS

Extended European Search Report issued in European Application No. 22204993.4 on Feb. 6, 2023.

Fox, G. R. et al., "Dependence of Perovskite/Pyrochlore Phase Formation on Oxygen Stoichiometry in PLT Thin Films," Journal of Materials Research, Materials Research Society, vol. 9, No. 3, Mar. 1, 1994, pp. 699-711.

Japanese Office Action for corresponding Japanese Application No. 2021-182843, dated May 7, 2025, with English translation.

* cited by examiner

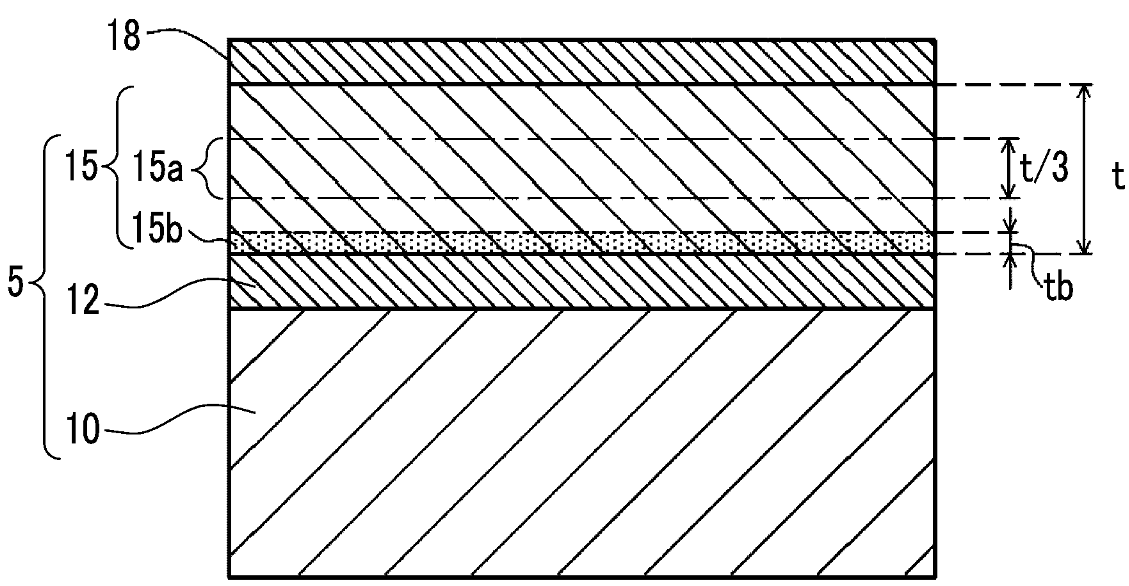
1
18
15
15a
15b
5
12
10
t/3
t
tb

EXAMPLE 1

COMPARATIVE EXAMPLE 1

FIG. 6
UPPER ELECTRODE LAYER
PIEZOELECTRIC FILM
LOWER ELECTRODE LAYER
CENTRAL REGION
OXYGEN-DEFICIENT REGION 1
OXYGEN-DEFICIENT REGION E1
β C1
β E1
k1
k2
EXAMPLE 1
COMPARATIVE EXAMPLE 1
OXYGEN SIGNAL INTENSITY
6000
5000
4000
3000
2000
1000
0
0
0.5
1
1.5
2
2.5
THICKNESS(μm)

PIEZOELECTRIC LAMINATE, PIEZOELECTRIC ELEMENT, AND MANUFACTURING METHOD FOR PIEZOELECTRIC LAMINATE

CROSS REFERENCE TO RELATED APPLICATIONS

The present application claims priority under 35 U.S.C. § 119 to Japanese Patent Application No. 2021-182843 filed on Nov. 9, 2021. The above application is hereby expressly incorporated by reference, in its entirety, into the present application.

BACKGROUND

Technical Field

The present disclosure relates to a piezoelectric laminate, a piezoelectric element, and a manufacturing method for piezoelectric laminate.

Related Art

As a material having excellent piezoelectric characteristics and excellent ferroelectricity, there is known a perovskite-type oxide such as lead zirconate titanate ($Pb(Zr,Ti)O_3$, hereinafter referred to as PZT). A piezoelectric body consisting of a perovskite-type oxide has been used in a piezoelectric film of a piezoelectric element. The piezoelectric element includes a lower electrode, a piezoelectric film, and an upper electrode on a substrate (WO2015/045845A and the like). The piezoelectric element has been used in various devices such as a memory, an inkjet head (an actuator), a micromirror device, an angular velocity sensor, a gyro sensor, a piezoelectric micromachined ultrasonic transducer (PMUT), and an oscillation power generation device.

In a case where the piezoelectric element is applied to a device, it is desirable that the piezoelectric characteristics are higher since the device performance is higher as the piezoelectric characteristics are higher. Among the piezoelectric materials, PZT has been widely used in various devices since it has particularly excellent piezoelectric characteristics. It is known that PZT adopts a pyrochlore structure that does not exhibit piezoelectricity, in addition to a perovskite structure that exhibits piezoelectricity. In particular, in the initial stage of film formation at the time of forming a PZT film, the pyrochlore phase is likely to grow, and thus in a case of attempting to improve the piezoelectric characteristics, it is important how to obtain a PZT film in which the pyrochlore phase is suppressed. The inclusion of the pyrochlore phase in the PZT film leads to the deterioration of piezoelectric characteristics and the deterioration of drive stability.

A well-known method suppressing the growth of the pyrochlore phase during the formation of a PZT film is a method using a seed layer (JP2019-052348A, JP2017-59751A, and the like). In a case of using strontium ruthenate ($SrRuO_3$), lead titanate ($PbTiO_3$), strontium titanate ($SrTiO_3$), and the like as a seed layer and forming a film of PZT on the seed layer to suppress a pyrochlore structure, it is possible to form a PZT film having a good perovskite structure. $SrRuO_3$, $PbTiO_3$, $SrTiO_3$, and the like are materials that do not easily adopt a pyrochlore structure and from which a perovskite structure is stably obtained.

SUMMARY

In a case of forming a PZT film on the seed layer as described above, it is possible to suppress the growth of the pyrochlore phase. However, providing a seed layer consisting of a material having a composition different from that of the lower electrode layer and the PZT film between the lower electrode layer and the PZT film leads to a rise in the process load and the manufacturing cost, such as an increase in the number of steps and an increase in material kind.

The technique according to the present disclosure has been made in consideration of the above circumstances, and an object according to the present disclosure is to provide a piezoelectric laminate, in which the growth of the pyrochlore phase is suppressed and the piezoelectric characteristics and the drive stability are improved without increasing an increase in process load and manufacturing cost, a piezoelectric element, and a manufacturing method for a piezoelectric laminate.

Specific means for solving the above problems include the following aspects.

The piezoelectric laminate according to the present disclosure is a piezoelectric laminate comprising, on a substrate in the following order:

a lower electrode layer; and a piezoelectric film containing a perovskite-type oxide as a main component, in which the piezoelectric film has an oxygen-deficient region in a region in contact with the lower electrode layer, in a case where an average value of oxygen amounts in a region centrally located among three regions obtained by dividing the piezoelectric film into three equal parts in a thickness direction is denoted as a first average oxygen amount, and an average value of oxygen amounts in the oxygen-deficient region is denoted as a second average oxygen amount, a ratio R of the second average oxygen amount to the first average oxygen amount is less than 0.97, and a thickness of the oxygen-deficient region is 120 nm or more and is ⅓ or less of a thickness of the entire piezoelectric film.

In the piezoelectric laminate according to the present disclosure, it is preferable that the ratio R is 0.91 or more and 0.95 or less.

In the piezoelectric laminate according to the present disclosure, it is preferable that the thickness of the oxygen-deficient region is 150 nm or more and is ¼ or less of the thickness of the entire piezoelectric film.

In the piezoelectric laminate according to the present disclosure, it is preferable that the piezoelectric film is a uniaxial alignment film aligned in the (100) direction.

In the piezoelectric laminate according to the present disclosure, it is preferable that the polarization direction of the piezoelectric film is a direction from a side of the lower electrode layer toward a film surface of the piezoelectric film.

In the piezoelectric laminate according to the present disclosure, it is preferable that the perovskite-type oxide contains Pb, Zr, Ti, and O.

In the piezoelectric laminate according to the present disclosure, it is preferable that the perovskite-type oxide contains one or more elements selected from V, Nb, Ta, Sb, Mo, and W in a B site.

In the piezoelectric laminate according to the present disclosure, it is preferable that the lower electrode layer in contact with the piezoelectric film is an Ir layer aligned on the (111) plane.

The piezoelectric element according to the present disclosure has the piezoelectric laminate and an upper electrode layer provided on the piezoelectric film of the piezoelectric laminate.

The manufacturing method for a piezoelectric laminate according to the present disclosure is a manufacturing method for a piezoelectric laminate including, on a substrate in the following order, a lower electrode layer and a piezoelectric film containing a perovskite-type oxide as a main component, the manufacturing method comprising:

a piezoelectric film forming step of forming a film of the piezoelectric film by sputtering, on the lower electrode layer;

in which in the piezoelectric film forming step, film formation is carried out to form a predetermined thickness in an initial stage of film formation at a first oxygen volume fraction, and the film formation is subsequently carried out to form a remaining thickness at a second oxygen volume fraction higher than the first oxygen volume fraction.

In the manufacturing method for a piezoelectric laminate according to the present disclosure, a predetermined thickness is preferably 25 nm or more.

According to the piezoelectric laminate, the piezoelectric element, and the manufacturing method for the piezoelectric laminate according to the present disclosure, it is possible to improve the piezoelectric characteristics and the drive stability without increasing the process load and the manufacturing cost.

BRIEF DESCRIPTION OF THE DRAWINGS

FIG. 1 is a cross-sectional view illustrating a layer configuration of a piezoelectric element according to one embodiment.

DESCRIPTION OF EMBODIMENTS

Figure 2:
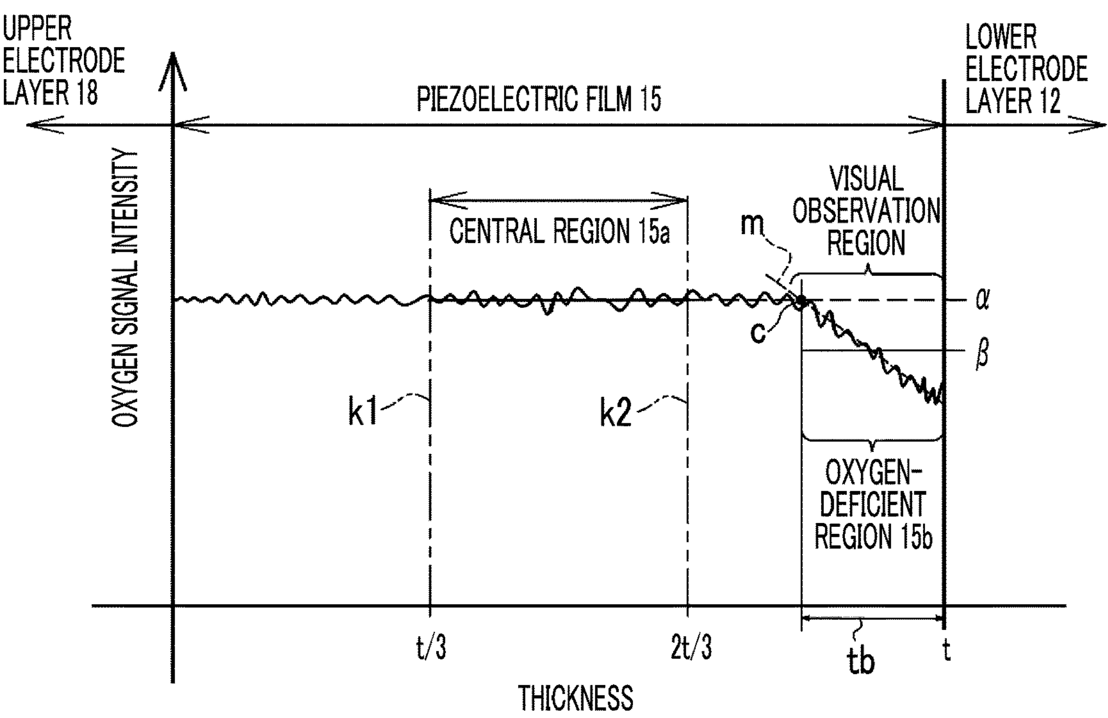
FIG. 2 is a schematic view illustrating a change in an oxygen amount in a thickness direction of a piezoelectric film.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

Piezoelectric Laminate and Piezoelectric Element

FIG. 1 is a schematic cross-sectional view illustrating layer configurations of a piezoelectric laminate 5 and a piezoelectric element 1 having the piezoelectric laminate 5, according to the embodiment. As illustrated in FIG. 1, the piezoelectric element 1 has the piezoelectric laminate 5 and an upper electrode layer 18. The piezoelectric laminate 5 has a substrate 10 and a piezoelectric film 15 laminated on the substrate 10, where the piezoelectric film 15 includes a lower electrode layer 12 and contains a perovskite-type oxide as a main component. Here, "lower" and "upper" do not respectively mean top and bottom in the vertical direction. As result, an electrode arranged on the side of the substrate 10 with the piezoelectric film 15 being interposed is merely referred to as the lower electrode layer 12, and an electrode arranged on the side of the piezoelectric film 15 opposite to the substrate 10 is merely referred to as the upper electrode layer 18.

The piezoelectric film 15 contains a perovskite-type oxide as a main component. Here, "contains as a main component" means that the perovskite-type oxide occupies 80% by mole or more of the piezoelectric film 15. It is more preferable that the perovskite-type oxide occupies 90% by mole or more of the piezoelectric film 15. Further, it is preferable that the perovskite-type oxide occupies substantially 100% by mole of the piezoelectric film 15 (however, it contains unavoidable impurities).

The piezoelectric film 15 has an oxygen-deficient region **15*b* in a region in contact with the lower electrode layer 12. In a case where an average value of oxygen amounts in a region 15*a* (hereinafter, referred to as a central region 15*a*) centrally located among three regions obtained by dividing the piezoelectric film 15 into three equal parts in a thickness direction is denoted as a first average oxygen amount, and an average value of oxygen amounts in the oxygen-deficient region 15*b*** is denoted as a second average oxygen amount, a ratio R of the second average oxygen amount to the first average oxygen amount is less than 0.97.

The perovskite-type oxide is generally represented by $ABO_3$. A represents an A-site element, B represents a B-site element, and O represents an oxygen element. A:B:O is 1:1:3 in terms of stoichiometric ratio. Although the ratio of the A-site element to the B-site element is A/B=1 in terms of stoichiometric ratio, A/B may deviate from 1 within a range in which the perovskite-type structure is maintained. In particular, in a case where A described later contains Pb as a main component, it is preferable to satisfy A/B>1. Details of the A-site element and the B-site element will be described later.

In the piezoelectric film 15, the A-site element, the B-site element, and the constitutional ratio thereof are the same over the entire region. On the other hand, the oxygen amount in the oxygen-deficient region **15*b* of the piezoelectric film 15 is small as compared with the oxygen amount in the central region 15*a*. The composition of the perovskite-type oxide in the oxygen-deficient region 15*b* is represented by $ABO_b$ ($b<3$). This means that the oxygen bonding amount in the perovskite-type oxide is small as compared with the stoichiometric ratio and the perovskite-type oxide has an oxygen defect. On the other hand, the perovskite-type oxide constituting the central region 15*a*** is represented by $ABO_a$, where the reference is a=3. Here, a may deviate from 3 within a range in which the perovskite structure is maintained and a relationship with b described below is satisfied. However, it is preferable to be a=3 since the piezoelectric constant is larger as the above ratio is closer to the stoichiometric ratio. Here, b/a is equal to the ratio R of the second average oxygen amount to the first average oxygen amount. That is, R=b/a.

In addition, as described above, in the piezoelectric element 1 of the present embodiment, the ratio R is less than 0.97 ($R=b/a<0.97$). The ratio R is preferably 0.91 or more and 0.95 or less ($0.91 \le R=b/a \le 0.95$).

Further, the thickness tb of the oxygen-deficient region **15*b* is 120 nm or more and is ⅓ or less of the thickness t of the entire piezoelectric film 15. The thickness tb of the oxygen-deficient region 15*b* is preferably 150 nm or more and is ¼ or less of the thickness t of the entire piezoelectric film 15, and it is more preferably 250 nm or more. The thickness t of the entire piezoelectric film 15** is preferably about 0.4 μm to 5 μm and more preferably 1 μm to 5 μm.

The oxygen signal intensity that is proportional to the oxygen amount in the piezoelectric film 15 can be measured by time-of-flight secondary ion mass spectrometry (TOF-SIMS). In the present disclosure, the ratio R of the second average oxygen amount to the first average oxygen amount is a value calculated based on the oxygen signal intensity data measured by TOF-SIMS. In addition, the thickness of the oxygen-deficient region 15*b* is determined based on the data measured by TOF-SIMS as well.

FIG. 2 is a view schematically illustrating an example of the oxygen signal intensity measured by TOF-SIMS. The vertical axis indicates the oxygen signal intensity that is proportional to the oxygen amount, and the lateral axis indicates the position in the piezoelectric film 15 in the thickness direction. In the example of FIG. 2, the oxygen signal intensity in the piezoelectric film 15 shows a substantially constant value from the upper electrode layer 18 side to the central region 15*a*, and it gradually decreases toward the lower electrode layer 12 on the lower electrode layer 12 side with respect to the central region 15*a*. As schematically illustrated in FIG. 2, since the signal value acquired actually includes noise, the signal value fluctuates finely.

A method of determining the ratio R of the first average oxygen amount to the second average oxygen amount will be described. Two virtual lines k1 (k1=t/3) and k2 (k2=2t/3) that divide the piezoelectric film 15 into three equal parts in the thickness direction are drawn. A region between the virtual lines k1 and k2 is the central region 15*a*. First, an average value α of signals at the respective thickness positions of the central region 15*a* (hereinafter, referred to as the average signal value α of the central region) is determined. In a region on the lower electrode layer 12 side with respect to the central region 15*a*, a region in which the signal value decreases from the average signal value α of the central region is visually determined, linear fitting is carried out with respect to the data in this region, and an approximation line m is drawn. An intersection of this approximation line m and the average signal value α of the central region is denoted by c. An area from the interface with the lower electrode layer 12 to this intersection c is regarded as the oxygen-deficient region 15*b*. That is, the distance from the interface with the lower electrode layer 12 to the intersection c is the thickness tb of the oxygen-deficient region 15*b* in the piezoelectric film 15. Then, the average value β of the signal values in the oxygen-deficient region 15*b* is determined (hereinafter, referred to as the average signal value β of the oxygen-deficient region).

As described above, the average signal value α of the central region and the average signal value β of the oxygen-deficient region are determined from the TOF-SIMS data, and β/α is calculated. Since the oxygen signal intensity is proportional to the oxygen amount, the ratio β/α of the average signal value β of the oxygen-deficient region to the average signal value α of the central region is equal to the ratio R of the average value (the second average oxygen amount) of the oxygen amounts in the oxygen-deficient region 15*b* to the average value (the first average oxygen amount) of the oxygen amounts in the central region 15*a* (R=β/α).

As described above, it is possible to determine the thickness tb of the oxygen-deficient region 15*b* and the ratio R of the second average oxygen amount to the first average oxygen amount from the TOF-SIMS data.

The A-site element A of the perovskite-type oxide constituting the piezoelectric film 15 is, for example, one of lead (Pb), barium (Ba), lanthanum (La), Sr, bismuth (Bi), lithium (Li), sodium (Na), calcium (Ca), cadmium (Cd), magnesium (Mg), or potassium (K), or a combination of two or more thereof.

The B-site element B is, for example, one of titanium (Ti), zirconium (Zr), vanadium (V), Nb (niobium), tantalum (Ta), chromium (Cr), molybdenum (Mo), tungsten (W), manganese (Mn), iron (Fe), Ru, cobalt (Co), Ir, nickel (Ni), copper (Cu), zinc (Zn), gallium (Ga), In, tin, antimony (Sb), or a lanthanide element, or a combination of two or more thereof.

The perovskite-type oxide contained in the piezoelectric film 15 is preferably a lead zirconate titanate (PZT) type that contains Pb, Zr, Ti, and O. Regarding the PZT-based perovskite-type oxide, an element other than Pb may be added to the A site within a range in which the perovskite-type structure can be maintained, or an element other than Zr and Ti may be added to the B site.

In particular, it is preferable that the perovskite-type oxide is a compound represented by General Formula (1), which contains an additive B1 in the B site of PZT.

$$Pb\{(Zr_xTi_{1-x})_{1-y}B1_y\}O_n \quad (1)$$

Here, B1 is preferably one or more elements selected from vanadium (V), niobium (Nb), tantalum (Ta), Sb (antimony), molybdenum (Mo), and tungsten (W). It is most preferable that B1 is Nb. Here, $0<x<1$ and $0<y<0.4$ are satisfied. n is the above a in the central region 15*a*, and it is the above-described b in the oxygen-deficient region 15*b*.

B1 may be a single element such as V only or Nb only, or it may be a combination of two or three or more elements, such as a mixture of V and Nb or a mixture of V, Nb, and Ta. In a case where B1 is these elements, a very high piezoelectric constant can be realized in combination with Pb of the A-site element.

Figure 3:
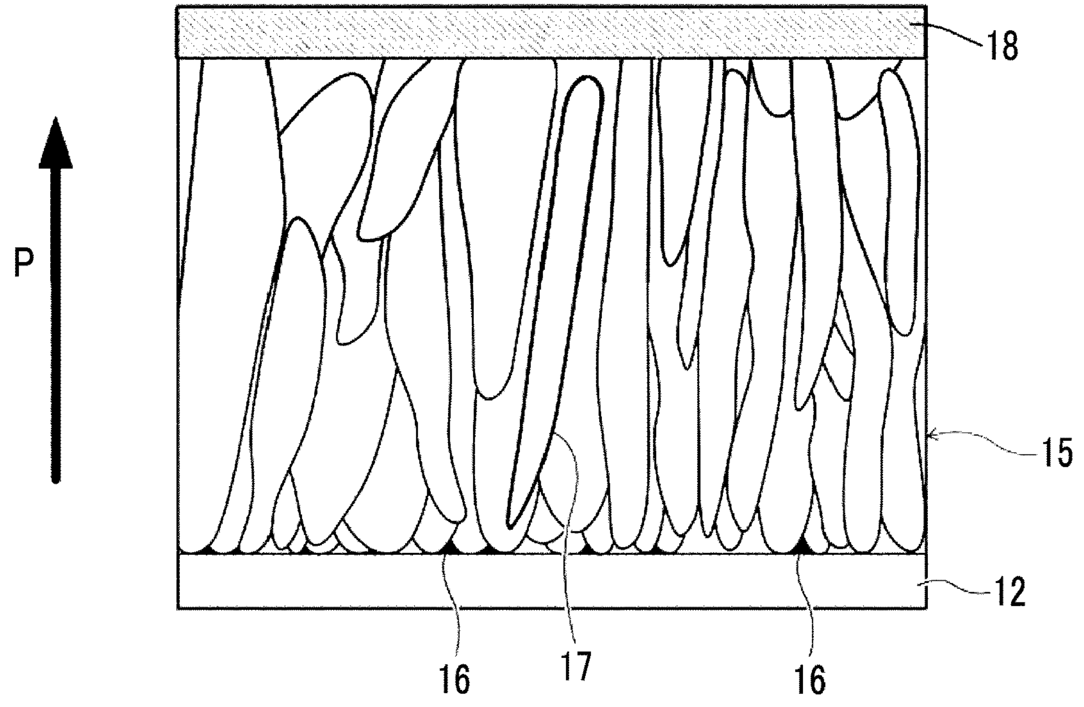
FIG. 3 is an enlarged schematic view of a piezoelectric film.

As illustrated in the schematic cross-sectional view of FIG. 3, the piezoelectric film 15 is preferably a columnar structure film having a columnar structure containing a large number of columnar crystal bodies 17. It is preferable that a large number of columnar crystal bodies 17 extend non-parallelly with respect to the surface of the substrate 10 (see FIG. 1) and are on a uniaxial alignment film aligned in the (100) direction. In a case of adopting an alignment structure, it is possible to obtain larger piezoelectricity. Further, as illustrated in FIG. 3, the polarization direction P of the piezoelectric film 15 is preferably a direction from the lower electrode layer 12 toward the upper electrode layer 18. That is, in the piezoelectric laminate 5, the polarization direction P of the piezoelectric film 15 is preferably a direction from the lower electrode layer 12 side toward the film surface on the upper electrode layer 18 side.

In the PZT-based perovskite-type oxide, in a case where V, Nb, Ta, Sb, Mo, or W is added as B1 in General Formula (1), the polarization in the direction directed from the lower electrode side toward the upper electrode side becomes stable. As a result, in a state immediately after the film formation by sputtering (as deposited), the piezoelectric film 15 is formed in a direction in which the polarization direction is directed from the lower electrode layer toward the upper electrode layer. B1 is particularly preferably Nb.

In addition, as illustrated in FIG. 3, the piezoelectric film 15 may include a pyrochlore phase 16 at an interface with the lower electrode layer 12. Even in a case where the pyrochlore phase 16 is included, the pyrochlore phase 16 is in a state of being sufficiently suppressed as compared with the piezoelectric film in the related art, the details of which will be described later. The pyrochlore phase 16 preferably has a thickness of 20 nm or less. It is noted that the pyrochlore phase 16 is not uniformly formed on the surface of the lower electrode layer 12 but is partially grown as illustrated in FIG. 3. The method of calculating the thickness of the pyrochlore phase 16 will be described in Examples. It is noted that in a case where the pyrochlore phase 16 is 20 nm or less, the peak of the pyrochlore phase is hardly observed in the X-ray diffraction (XRD) chart (see Examples).

The substrate 10 is not particularly limited, and examples thereof include substrates such as silicon, glass, stainless steel, yttrium-stabilized zirconia, alumina, sapphire, and silicon carbide. As the substrate 10, a laminated substrate having a $SiO_2$ oxide film formed on the surface of the silicon substrate, such as a thermal oxide film-attached silicon substrate, may be used.

The lower electrode layer 12 is paired with the upper electrode layer 18 and is an electrode for applying a voltage to the piezoelectric film 15. The main component of the lower electrode layer 12 is not particularly limited, and examples thereof include metals such as gold (Au), platinum (Pt), iridium (Ir), ruthenium (Ru), Ti, Mo, Ta, aluminum (Al), copper (Cu), and silver (Ag), and metal oxides thereof, as well as combinations thereof. Further, indium tin oxide (ITO) may be used. In particular, it is preferable that the lower electrode layer 12 has an Ir layer aligned on the (111) plane, on a surface in contact with the piezoelectric film 15.

The layer thickness of the lower electrode layer 12 is not particularly limited, and it is preferably about 50 nm to 300 nm and more preferably 100 nm to 300 nm.

The upper electrode layer 18 is paired with the lower electrode layer 12 and is an electrode for applying a voltage to the piezoelectric film 15. The main component of the upper electrode layer 18 is not particularly limited, and examples thereof include, in addition to the electrode material that is generally used in the semiconductor process, a conductive oxide such as indium tin oxide (ITO), $LaNiO_3$, or ($SrRuO_3$ (SRO), and a combination thereof.

The layer thickness of the upper electrode layer 18 is not particularly limited, and it is preferably about 50 nm to 300 nm and more preferably 100 nm to 300 nm.

In the piezoelectric laminate 5 and the piezoelectric element 1 of the present embodiment, the piezoelectric film 15 has the oxygen-deficient region **15*b* in a region in contact with the lower electrode layer 12. At the time of forming the piezoelectric film 15 containing a perovskite-type oxide as a main component on the lower electrode layer 12, it is possible to suppress the growth of the pyrochlore phase in a case of first growing the perovskite-type oxide having an oxygen defect. In particular, in a case where an average value of oxygen amounts in a region centrally located among three regions obtained by dividing the piezoelectric film 15 into three equal parts in a thickness direction is denoted as a first average oxygen amount, and an average value of oxygen amounts in the oxygen-deficient region is denoted as a second average oxygen amount, and in a case where a ratio R of the second average oxygen amount to the first average oxygen amount is less than 0.97, and the thickness tb of the oxygen-deficient region 15*b* is more than 100 nm, the effect of suppressing the growth of the pyrochlore phase can be ensured. Since it is possible to sufficiently suppress the pyrochlore phase, it is possible to obtain the piezoelectric laminate 5 and the piezoelectric element 1, which have the piezoelectric film 15 containing a good perovskite-type oxide. Since the piezoelectric film 15 in which the pyrochlore phase is suppressed is provided, it is possible to obtain high piezoelectric characteristics, and it is possible to obtain higher drive stability as compared with the case of the related art. In addition, in a case where the thickness tb of the oxygen-deficient region 15*b* is set to ⅓ or less of the thickness t of the entire piezoelectric film 15**, the deterioration of piezoelectric characteristics and the deterioration of drive stability can be suppressed. Here, the drive stability means that stable driving is possible for a long period of time.

In addition, the piezoelectric laminate 5 and the piezoelectric element 1 of the present embodiment use the oxygen-deficient region **15*b* as the seed layer; however, they have the identical composition except for the oxygen amount throughout the entire piezoelectric film 15, and thus it is possible to suppress the process load and the increase in manufacturing cost as compared with the piezoelectric element in the related art including a seed layer consisting of a material different from the piezoelectric film. That is, according to the technique according to the present disclosure, it is possible to improve the piezoelectric characteristics and the drive stability without increasing the process load and the manufacturing cost, according to the piezoelectric laminate 5 and the piezoelectric element 1**.

In a case where the ratio R of the second average oxygen amount in the oxygen-deficient region **15*b* to the first average oxygen amount in the central region 15*a* is 0.91 or more and 0.95 or less, the effect of suppressing the pyrochlore phase is particularly high. In addition, in a case where the thickness of the oxygen-deficient region 15*b* is 150 nm or more and is ¼ of the thickness of the entire piezoelectric film 15**, it is possible to achieve both the effect of suppressing the pyrochlore phase and the maintenance of a high piezoelectric constant.

The piezoelectric film 15 contains a perovskite-type oxide; however, in a case where it contains particularly a perovskite-type oxide containing Pb, the pyrochlore phase is easily formed in the initial stage of film formation. As a result, in a case where the piezoelectric film 15 contains a perovskite-type oxide containing Pb as a main component, the effect of suppressing the pyrochlore phase is particularly high. Among the perovskite-type oxides containing Pb, a PZT-based perovskite-type oxide containing Pb, Zr, Ti, and O has high piezoelectric characteristics and thus is particularly preferable. In particular, in a case where the perovskite-type oxide is a compound represented by General Formula (1) described above, and B1 is one or more elements selected from V, Nb, Ta, Sb, Mo, and W, still higher piezoelectric characteristics can be obtained.

In addition, as described above, in a case of adding the B1 element to the B site, the direction of the polarization direction of the piezoelectric film 15 can be set to be a direction directed from the lower electrode layer toward the upper electrode layer in a state immediately after the film formation. As a result, high piezoelectricity can be obtained without carrying out the polarization treatment.

Ir is suitable as the lower electrode layer 12. Since Ir has good adhesiveness to the piezoelectric film 15, peeling of the lower electrode layer 12 from the piezoelectric film 15 can be suppressed. Ir has high conductivity and thus can achieve the reduction of the resistance of the lower electrode layer 12. In addition, even in a case where the temperature of Ir is high during the formation of the piezoelectric film, element diffusion is less likely to occur as compared with other metals such as Au, and the drive stability is high. On the other hand, Ir is preferentially aligned on the (111) plane in a case where a film of Ir is formed by sputtering or the like. In a case where a PZT-based perovskite-type oxide is formed on the (111) plane, the pyrochlore phase is likely to be formed in the initial stage of the film formation. As a result, at the time of forming the piezoelectric film 15 on the lower electrode layer 12 consisting of the (111) plane-aligned Ir layer, the effect of suppressing the growth of the pyrochlore phase by providing the oxygen-deficient region 15*b* in a region in contact with the lower electrode layer 12 is particularly high.

Manufacturing Methods for Piezoelectric Laminate and Piezoelectric Element

The piezoelectric laminate and the piezoelectric element can be manufactured as follows.

A piezoelectric laminate 5 can be obtained by forming a film of the lower electrode layer 12 on the substrate 10 and subsequently forming the piezoelectric film 15, and further, the piezoelectric element 1 can be obtained by forming a film of the upper electrode layer 18 on the piezoelectric film 15. The film formation by sputtering is suitable for the film formation of each of the layers 12, 15, and 18.

In the film forming step of the piezoelectric film 15, the oxygen volume fraction in the film forming gas inside the film forming chamber is changed at the time of forming a film by sputtering. Specifically, film formation is carried out to form a thickness of the piezoelectric film 15, which is predetermined in an initial stage of film formation, at a first oxygen volume fraction, and then the film formation is subsequently carried out to form a remaining thickness at a second oxygen volume fraction obtained by increasing the oxygen volume fraction. By setting to "the first oxygen volume fraction<the second oxygen volume fraction", the oxygen-deficient region 15*b* having an oxygen amount smaller than that of the central region 15*a* is formed in a region in contact with the lower electrode layer 12, and then the piezoelectric film 15 containing the perovskite-type oxide having an oxygen amount of the stoichiometric ratio or close to the stoichiometric ratio is grown.

For example, an oxygen volume fraction at which a film of the perovskite-type oxide having a stoichiometric ratio can be formed is examined in advance, and the oxygen volume fraction at which a film of the perovskite-type oxide having a stoichiometric ratio can be formed is set as the second oxygen volume fraction. The first oxygen volume fraction is set to an oxygen volume fraction smaller than the second oxygen volume fraction, at which a perovskite-type oxide having a small oxygen bonding amount as compared with the stoichiometric ratio is formed. The second oxygen volume fraction is, as an example, about 8% or more and about 15% or less, and the first oxygen volume fraction is, as an example, about 2% or more and less than 8%.

The predetermined thickness to be formed at the first oxygen volume fraction is preferably 15 nm or more and more preferably 25 nm or more. As an example, a film of 15 nm to 200 nm, preferably 25 nm to 150 nm, and more preferably 50 nm to 100 nm is formed at the first oxygen volume fraction. Then, the first oxygen volume fraction is changed to the second oxygen volume fraction, and the film is formed until a desired thickness is obtained at the second oxygen volume fraction. In this way, it is possible to suppress the growth of the pyrochlore phase in the initial stage of film formation by forming a film having a constant thickness in the initial stage of film formation at the first oxygen volume fraction. By forming 25 nm or more of the piezoelectric film 15 at the first oxygen volume fraction in the initial stage of film formation, the effect of suppressing the pyrochlore phase can be further ensured. In addition, in a case where a film of a perovskite-type oxide containing Pb is to be formed, the effect of suppressing the growth of the pyrochlore phase according to the present manufacturing method is high since the pyrochlore phase is likely to grow in the initial stage of film formation.

In the film forming step of the piezoelectric film 15, conditions other than the oxygen volume fraction are not changed. That is, the film forming conditions other than the oxygen volume fraction, such as the target, the power input to the target, the vacuum degree (film formation pressure) inside the film forming chamber, and the substrate temperature, are identical until the entire piezoelectric film 15 is formed. This makes it possible for the piezoelectric film 15 to have the same composition even in the thickness direction except for the oxygen amount.

It is noted that in the piezoelectric film 15 obtained by carrying out film formation to a predetermined thickness at the first oxygen volume fraction and then the film formation is carried out to a desired thickness t at the second oxygen volume fraction, the oxygen-deficient region 15*b* extends over a range wider than the thickness of the film formed at the first oxygen volume fraction (see Examples). As a result, the thickness tb of the oxygen-deficient region 15*b* in the piezoelectric film 15 in the piezoelectric laminate 5 and the piezoelectric element 1 obtained according to the above-described manufacturing method is different from the predetermined thickness to be formed at the first oxygen volume fraction in the film forming step.

The piezoelectric element 1 or the piezoelectric laminate 5 according to each of the above embodiments can be applied to an ultrasonic device, a mirror device, a sensor, a memory.

EXAMPLES

Hereinafter, specific examples and comparative examples of the piezoelectric element according to the present disclosure will be described. First, a production method for a piezoelectric element of each example will be described. A radio frequency (RF) sputtering device was used for the film formation of each layer. It is noted that the conditions other than the piezoelectric film were set to be common between respective examples. The description of the production method will be made with reference to the reference numerals of the respective layers of the piezoelectric element 1 illustrated in FIG. 1.

Film Formation of Lower Electrode Layer

As the substrate 10, a thermal oxide film-attached silicon substrate having a size of 4 inches was used. The lower electrode layer 12 was formed into a film on the substrate 10 by radio-frequency (RF) sputtering. Specifically, a film of a TiW layer having a thickness of 50 nm was formed on the substrate 10 as the lower electrode layer 12, and subsequently, an Ir layer having a thickness of 200 nm was formed. That is, the lower electrode layer 12 has a two-layer structure of a TiW layer and an Ir layer. The sputtering conditions for each layer were as follows.

Sputtering Conditions for TiW Layer

Distance between target and substrate: 100 mm
Target input power: 600 W
Ar gas pressure: 0.5 Pa
Set temperature of substrate: 350° C.

Sputtering Conditions for Ir Layer

Distance between target and substrate: 100 mm
Target input power: 600 W
Ar gas pressure: 0.1 Pa
Set temperature of substrate: 350° C.

Formation of Piezoelectric Film

The substrate 10 attached with the lower electrode layer 12 was placed in the inside of an RF sputtering device, and an Nb-doped PZT film of 2 μm was formed as the piezoelectric film 15, where the Nb-doping amount to the B site was set to 12 at %. Here, a $Pb_{1.3}Zr_{0.435}Ti_{0.445}Nb_{0.12}O_3$ target was used. The film formation rate was set to 100 nm/min, and a film was formed for a total of 20 minutes to obtain a piezoelectric film 15 having a thickness of about 2 The sputtering conditions at this time were as follows.

Sputtering Conditions for Piezoelectric Film

Distance between target and substrate: 60 mm

Target input power: 500 W

Vacuum degree: 0.3 Pa, an Ar and $O_2$ mixed atmosphere

Set temperature of substrate: 700° C.

The above conditions were set to be common in the entire region of the piezoelectric film, and the condition of the oxygen volume fraction inside the film forming chamber was set to be different between respective Examples and Comparative Examples. For each Example and Comparative Example, the condition of the oxygen volume fraction at the time of forming the piezoelectric film was as follows. In Comparative Examples 1 and 2, the oxygen volume fraction was common in the entire region of the piezoelectric film, and in Examples 1 to 7, the first oxygen volume fraction was used in the initial stage of the formation of the piezoelectric film, which subsequently changed to the second oxygen volume fraction.

Example 1

Film formation was carried out at an oxygen volume fraction of 5% for only 1 minute in the initial stage of film formation (thickness: 100 nm), and the film formation was carried out at an oxygen volume fraction of 10% for the remaining 19 minutes.

Example 2

Film formation was carried out at an oxygen volume fraction of 6% for only 1 minute in the initial stage of film formation (thickness: 100 nm), and the film formation was carried out at an oxygen volume fraction of 10% for the remaining 19 minutes.

Example 3

Film formation was carried out at an oxygen volume fraction of 7.5% for only 1 minute in the initial stage of film formation (thickness: 100 nm), and the film formation was carried out at an oxygen volume fraction of 10% for the remaining 19 minutes.

Example 4

Film formation was carried out at an oxygen volume fraction of 2% for only 1 minute in the initial stage of film formation, that is, to a thickness of 100 nm, and the film formation was carried out at an oxygen volume fraction of 10% for the remaining 19 minutes.

Example 5

Film formation was carried out at an oxygen volume fraction of 5% for only 2 minutes in the initial stage of film formation, that is, to a thickness of 200 nm, and the film formation was carried out at an oxygen volume fraction of 10% for the remaining 18 minutes.

Example 6

Film formation was carried out at an oxygen volume fraction of 5% for only 30 seconds (0.5 minutes) in the initial stage of film formation, that is, to a thickness of 50 nm, and the film formation was carried out at an oxygen volume fraction of 10% for the remaining 19 minutes and 30 seconds.

Example 7

Film formation was carried out at an oxygen volume fraction of 5% for only 15 seconds (about 0.25 minutes) in the initial stage of film formation, that is, to a thickness of 25 nm, and the film formation was carried out at an oxygen volume fraction of 10% for the remaining 19 minutes and 45 seconds.

Example 8

Film formation was carried out at an oxygen volume fraction of 5% for only 10 seconds (about 0.17 minutes) in the initial stage of film formation, that is, to a thickness of 17 nm, and the film formation was carried out at an oxygen volume fraction of 10% for the remaining 19 minutes and 50 seconds.

Comparative Example 1

Film formation was carried out for entire 20 minutes (thickness: 2 μm) at an oxygen volume fraction of 10%.

Comparative Example 2

Film formation was carried out for entire 20 minutes (thickness: 2 μm) at an oxygen volume fraction of 5%.

Table 1 summarizes the conditions that were set to be different during the formation of the piezoelectric film in respective examples.

TABLE 1

| | First oxygen volume fraction [%] | Film forming time [minute] | Formed film thickness at first oxygen volume fraction [mm] | Second oxygen volume fraction [%] | Film forming time [minute] |
|---|---|---|---|---|---|
| Example 1 | 5 | 1 | 100 | 10 | 19 |
| Example 2 | 6 | 1 | 100 | 10 | 19 |
| Example 3 | 7.5 | 1 | 100 | 10 | 19 |
| Example 4 | 2 | 1 | 100 | 10 | 19 |
| Example 5 | 5 | 2 | 200 | 10 | 18 |
| Example 6 | 5 | 0.5 (30 s) | 50 | 10 | 19.5 |
| Example 7 | 5 | 0.25 (15 s) | 25 | 10 | 19.75 |
| Example 8 | 5 | 0.17 (10 s) | 17 | 10 | 19.83 |
| Comparative Example 1 | 10 | 20 | 2000 | — | — |
| Comparative Example 2 | 5 | 20 | 2000 | — | — |

Film Formation of Upper Electrode Layer

Next, the substrate 10 after forming the piezoelectric film 15 was placed in a film forming chamber of the RF sputtering device, and by using an indium tin oxide (ITO) target, an ITO layer was formed into a film having a thickness of 200 nm as the upper electrode layer 18. It is noted that before the film formation of the upper electrode layer 18, a lift-off pattern for an evaluation sample was prepared on the piezoelectric film 15, and the upper electrode layer 18 was formed on the lift-off pattern. The film forming conditions for the upper electrode layer 18 were as follows.

Sputtering Conditions for Upper Electrode Layer

Distance between target and substrate: 100 mm

Target input power: 200 W

Vacuum degree: 0.3 Pa, an Ar and $O_2$ mixed gas ($O_2$ volume fraction: 5%)

Set temperature of substrate: room temperature (RT)

Formation of electrode pattern for evaluation

After the formation of the upper electrode layer 18, the upper electrode layer 18 was lifted off along the lift-off pattern according to the lift-off method to carry out the pattering of the upper electrode layer 18.

Through the above steps, the piezoelectric laminated substrate of each example, having the lower electrode layer 12, the piezoelectric film 15, and the patterned upper electrode layer 18 on the substrate 10, was produced.

Preparation of Evaluation Sample

Evaluation Sample 1

A strip-shaped portion of 2 mm×25 mm was cut out from the piezoelectric laminated substrate to prepare a cantilever as an evaluation sample 1.

Evaluation Sample 2

A portion of 25 mm×25 mm having, at the center of the surface of the piezoelectric film 15, an upper electrode layer 18 that had been patterned in a circular shape having a diameter of 400 μm, was cut out from the piezoelectric laminated substrate and used as an evaluation sample 2.

Evaluation of Piezoelectric Characteristics

The piezoelectric constant $d_{31}$ was measured for the evaluation of the piezoelectric characteristics of each of Examples and Comparative Examples. The larger the absolute value of the piezoelectric constant d31, the higher the piezoelectric characteristics, and the smaller the absolute value thereof, the lower the piezoelectric characteristics.

The piezoelectric constant $d_{31}$ was measured by using the above-described evaluation sample 1 according to the method described in I. Kanno et. al., Sensor and Actuator A 107 (2003) 68, at an applied voltage of a sinusoidal wave of −10 V±10 V. The results are shown in Table 2.

Evaluation of Drive Stability

A time dependent dielectric breakdown (TDDB) test was carried out for the evaluation of drive stability. Using the evaluation sample 2, in an environment of 120° C., the lower electrode layer 12 was grounded, a voltage of −40 V was applied to the upper electrode layer 18, and the time (hr) taken from the start of the voltage application to the occurrence of dielectric breakdown was measured. The measurement results are shown in Table 2. The dielectric breakdown is defined by a case where a current of 1 mA or more flows when a voltage is applied to a circular upper electrode layer of 400 μm. It is noted that the TDDB test was carried out for 1,000 hours, and those in which dielectric breakdown did not occur up to 1,000 hours are described as 1,000 in Table 2.

Evaluation of Crystallinity

The crystallinity of the piezoelectric film of the piezoelectric laminate of each example was evaluated by the XRD analysis using RINT-ULTIMA III manufactured by Rigaku Corporation.

Evaluation of Peak Intensity Derived from Pyrochlore Phase

Figure 4:
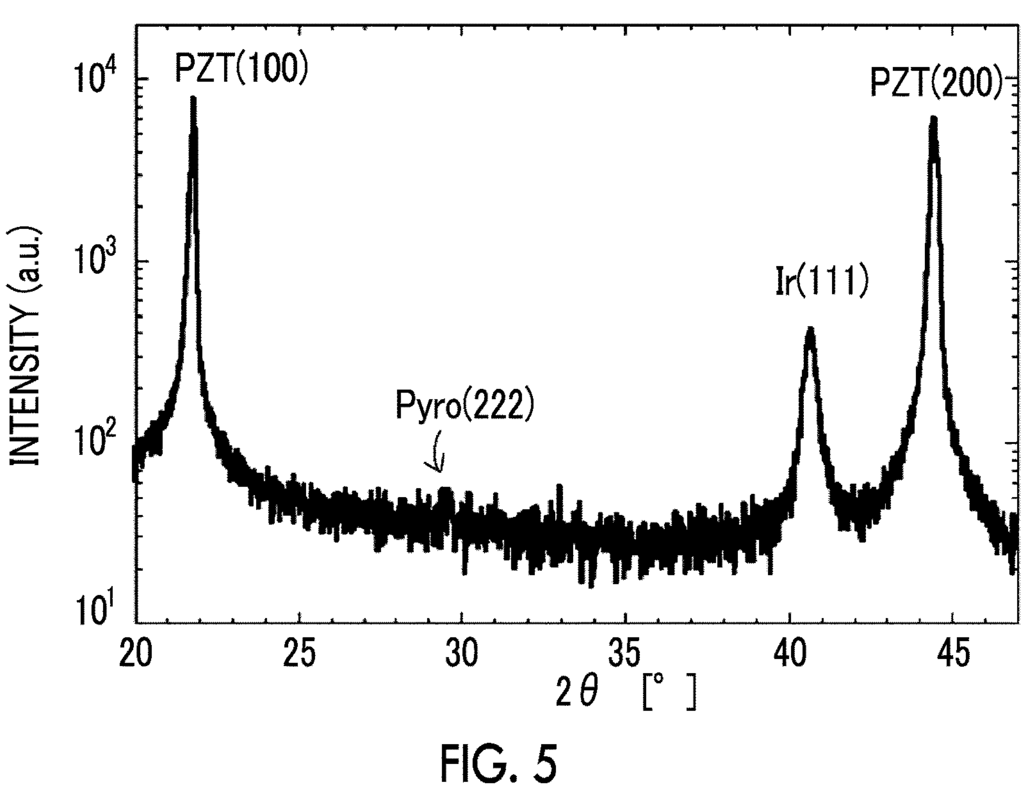
FIG. 4 is an XRD chart of Example 1.
Figure 5:
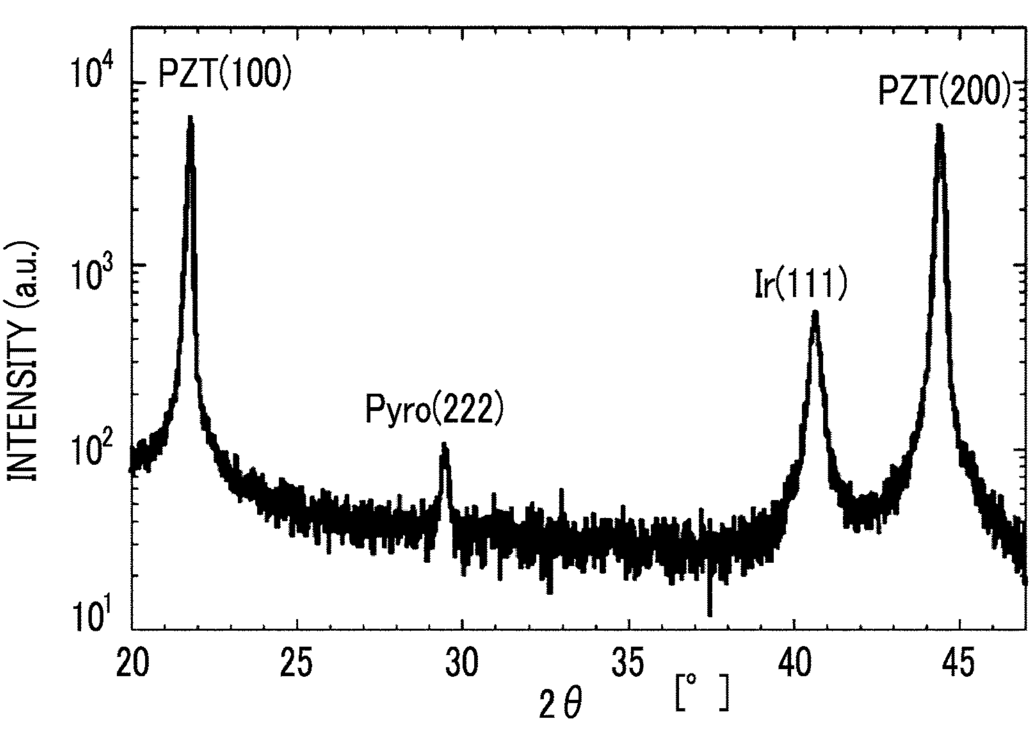
FIG. 5 is an XRD chart of Comparative Example 1.

FIG. 4 shows an XRD chart from Example 1, and FIG. 5 shows an XRD chart from Comparative Example 1. The evaluation of crystallinity was carried out using the piezoelectric laminate before the film formation of the upper electrode layer.

From the XRD chart obtained from each example, the intensity of the pyrochlore phase (222), which is a different phase, was determined. The region where the pyrochlore phase (222) was detected was in the vicinity of 29°, and the peak intensity derived from the pyrochlore phase (222) was adopted as a peak intensity obtained by removing the noise derived from the background, from the obtained XRD diffraction intensity (counts).

In addition, from the XRD chart, py (222)/{pr (100)+pr (110)+pr (111)}×100% was calculated as the pyrochlore rate.

The intensity from each plane was determined as follows.

The average value of the numbers of counts in a case where 2θ is 25° to 28° is defined as the noise N derived from the background.

The intensity of py (222) was defined as the value obtained by eliminating N from the maximum number of counts in a range in which 2θ was 28° to 30°.

The intensity of pr (100) was defined as the value obtained by eliminating N from the maximum number of counts in a range in which 2θ was 21° to 23°.

The intensity of pr (110) was defined as the value obtained by eliminating N from the maximum number of counts in a range in which 2θ was 30° to 32°.

The intensity of pr (111) was defined as the value obtained by eliminating N from the maximum number of counts in a range in which 2θ was 37.5° to 39.5°.

In FIG. 4 and FIG. 5, the peak values of the perovskite phase (100) are the same. On the other hand, there is a difference in the pyrochlore phase (222). As shown in FIG. 5, in Comparative Example 1, there is a clear peak of the pyrochlore phase (222) in the vicinity of 29°. In Example 1 shown in FIG. 4, the peak value of the pyrochlore phase (222) was decreased as compared with the case of Comparative Example 1 and thus hardly observed. As shown in FIG. 4 and FIG. 5, a PZT film uniaxially aligned at (001) was obtained.

Evaluation of Pyrochlore Phase Thickness

Regarding Examples and Comparative Examples, transmission electron microscope (TEM) images were captured, and the thickness of the pyrochlore phase was determined from the TEM images. In the piezoelectric film, the contrast in the TEM image differs between the pyrochlore phase and the perovskite phase, and thus it is possible to specify the region of the pyrochlore phase and calculate the thickness thereof. It is noted that it was observed that columnar crystal bodies of the perovskite-type oxide were formed in the portion of the piezoelectric film other than the pyrochlore phase. The thickness of the pyrochlore phase was calculated as an average thickness since the pyrochlore phase was not uniformly formed on the surface of the lower electrode layer.

Specifically, the contrast adjustment function of the image processing software is used to binarize the original image at a predetermined threshold value, and the edge extraction function of the image processing software is used to extract the pyrochlore phase. In this case, the threshold value is such that noise is removed as much as possible and only those that can be clearly distinguished from the pyrochlore phase are extracted. In a case where the outline of the pyrochlore-type oxide layer is unclear in the binarized image, the outline is empirically drawn while looking at the binarized image, and the inside thereof is filled. The area of the extracted pyrochlore phase is calculated from the number of pixels obtained from the image processing software and divided by the visual field width of the TEM image to obtain the average layer thickness. As the image processing software, Photoshop (registered trade name) was used here. Table 2 shows the thickness of the pyrochlore phase obtained as described above.

Measurement of Oxygen Amount in PZT: TOF-SIMS

TOF-SIMS is a method in which a solid sample is irradiated with ion beams (primary ions), and ions (secondary ions) released from the surface are subjected to the mass-separation by using the flight time difference of the ions, thereby measuring a specific element amount. In the present Example, the analysis was carried out using the following devices.

Measuring device: TOF_SIMS 5 manufactured by ION-TOF

Primary ion source: Bi

Sputter ion source: Cs

As a sample for TOF-SIMS measurement, a piece of 1 cm×1 cm was cut out from the piezoelectric laminated substrate of each example, and the piezoelectric film 15 was peeled off at an interface with the lower electrode layer 12. The measurement was carried out by irradiating, with ion beams, a range of a square of 50 μm from the side of the peeled surface of the piezoelectric film 15 from which the lower electrode layer 12 was peeled.

Table 2 shows the results of the oxygen amount in the central region, the oxygen amount in the oxygen-deficient region, and the thickness of the oxygen-deficient region in the piezoelectric film, which are obtained from the measurement data obtained by TOF-SIMS.

Figure 6:
FIG. 6 is a view showing TOF-SIMS data of Example 1 and Comparative Example 1.

As an example, FIG. 6 shows oxygen amount measurement data in the piezoelectric films of Examples 1 and Comparative Example 1. As shown in FIG. 6, first, virtual lines k1 and k2 that divide the piezoelectric film into three equal parts in the thickness direction were drawn to determine the central region. Then, the average value α (the average signal value α of the central region) of oxygen signal intensities of the central region was calculated. In Example 1 and Comparative Example 1, the average value α of the central region was the same. Then, in a region on the lower electrode layer side with respect to the central region, a region in which the signal value decreases from the average signal value α of the central region is visually determined, linear fitting is carried out with respect to the data in this region, and an approximation line was drawn. The thickness from the interface on the lower electrode side (here, the peeled surface) to the intersection of the approximation line and the average signal value α of the central region was determined as the thickness of the oxygen-deficient region. Then, the average value β of the oxygen signal intensities in the oxygen-deficient region was determined. In FIG. 6, the oxygen-deficient region for Example 1 is shown as an oxygen-deficient region E1, and the oxygen-deficient region for Comparative Example 1 is shown as an oxygen-deficient region C1. In addition, β E1 is an average value of oxygen signal intensities for Example 1, and β C1 is an average value of oxygen signal intensities for Comparative Example 1.

Table 3 shows the average signal value α of the central region, the average signal value β of the oxygen-deficient region, the ratio R (=β/α) of the average oxygen amount (the second average oxygen amount) of the oxygen-deficient region to the average oxygen amount (the first average oxygen amount) of the central region, and the thickness tb of the oxygen-deficient region in each example.

The respective evaluation results are shown in Table 2 and Table 3.

TABLE 2

| | Pyrochlore thickness [nm] | Pr(222)/ Pv(100) [%] | Piezoelectric constant $d_{31}$ [pm/V] | Drive stability test [h] |
|---|---|---|---|---|
| Example 1 | 10 | 0.2 or less | 230 | 1000 |
| Example 2 | 10 | 0.2 or less | 220 | 1000 |
| Example 3 | 30 | 0.5 | 200 | 1000 |
| Example 4 | 10 | 0.2 or less | 210 | 1000 |
| Example 5 | 10 | 0.2 or less | 200 | 1000 |
| Example 6 | 10 | 0.2 or less | 230 | 1000 |
| Example 7 | 20 | 0.2 or less | 220 | 1000 |
| Example 8 | 50 | 2 | 190 | 750 |
| Comparative Example 1 | 100 | 4 | 160 | 500 |
| Comparative Example 2 | 10 | 0.2 or less | 80 | 100 |

TABLE 3

| | Average signal value α of central region | Average signal value β of oxygen-deficient region | β/α | Thickness tb of oxygen-deficient region [nm] |
|---|---|---|---|---|
| Example 1 | 4700 | 4400 | 0.94 | 400 |
| Example 2 | 4700 | 4450 | 0.95 | 400 |
| Example 3 | 4700 | 4500 | 0.96 | 400 |
| Example 4 | 4700 | 4300 | 0.91 | 400 |
| Example 5 | 4700 | 4350 | 0.93 | 500 |
| Example 6 | 4700 | 4350 | 0.93 | 250 |
| Example 7 | 4700 | 4300 | 0.91 | 150 |
| Example 8 | 4700 | 4300 | 0.91 | 120 |
| Comparative Example 1 | 4700 | 4550 | 0.97 | 100 |
| Comparative Example 2 | 4100 | 4050 | 0.99 | 30 |

In Examples 1 to 8 in which a film of 17 nm or more was formed at the first oxygen volume fraction and the thickness of the oxygen-deficient region was 120 nm or more, the piezoelectric constant was high and the drive stability was high as well as compared with Comparative Examples 1 and 2. Among Examples 1 to 8, in Examples 1 to 7 in which a film of 25 nm or more was formed at the first oxygen volume fraction and the thickness of the oxygen-deficient region was 150 nm or more, the obtained results were such that the effect of suppressing the pyrochlore phase was high and both the piezoelectric constant and the drive stability was good as compared with Example 8.

In both Comparative Examples 1 and 2, the film formation was carried out at the identical oxygen volume fraction over the entire region of the piezoelectric film. The piezoelectric film of Comparative Example 1 is formed over the entire region at an oxygen volume fraction at which a perovskite phase having an oxygen bonding amount of the stoichiometric ratio is obtained, and the piezoelectric film of Comparative Example 2 is formed over the entire region at an oxygen volume fraction at which a perovskite phase having an oxygen bonding amount smaller than the stoichiometric ratio is obtained. In both Comparative Examples 1 and 2, although the oxygen volume fraction was not changed, an oxygen-deficient region having an oxygen defect was formed at the interface with the lower electrode layer. However, as compared with a case where film formation was carried out at the first oxygen volume fraction in the initial stage of film formation, and then the oxygen volume fraction was increased to carry out the film formation at the second oxygen volume fraction as in Examples 1 to 8, the difference between the oxygen amount in the central region and the oxygen amount in the oxygen-deficient region is small, and the thickness of the oxygen-deficient region is also small. In a case where the entire piezoelectric film was formed at an oxygen volume fraction of 5% as in Comparative Example 2, an effect equivalent to the effect of suppressing the pyrochlore phase in Examples was obtained. From these results, it can be concluded that growing a perovskite-type oxide having an oxygen bonding amount smaller than the oxygen bonding amount of the stoichiometric ratio in a region in contact with the lower electrode layer is effective in suppressing the pyrochlore phase. On the other hand, in a case where film formation was carried out at an oxygen volume fraction of 5% in Comparative Example 2, the piezoelectric constant is significantly reduced to ½ as compared with a case where film formation was carried out at an oxygen volume fraction of 10% in Comparative Example 1. From these results, it is revealed that the perovskite-type oxide containing an oxygen defect has a low piezoelectric constant and low drive stability as compared with a perovskite-type oxide having a small oxygen defect or having the stoichiometric ratio.

All Examples 1 to 8 have an oxygen-deficient region in a region in contact with the lower electrode layer and satisfy that the ratio R of the second average oxygen amount, which is an average value of the oxygen amounts in the oxygen-deficient region, to the first average oxygen amount, which is an average value of the oxygen amounts in the central region is less than 0.97, and the thickness of the oxygen-deficient region is 120 nm or more and is ⅓ or less of the thickness of the entire piezoelectric film. In Examples 1 to 8, the growth of the pyrochlore phase could be suppressed without providing a seed layer having a composition different from that of the piezoelectric film. That is, the pyrochlore phase could be suppressed without increasing the process load and the manufacturing cost. By setting the thickness of the oxygen-deficient region to ⅓ or less of the thickness of the entire piezoelectric film, the decrease in the piezoelectric constant and the drive stability could be suppressed, and the improvement of the piezoelectric constant and the improvement of the drive stability due to the effect of suppressing the pyrochlore phase could be realized.

What is claimed is:

1. A piezoelectric laminate comprising in the following order:

a substrate;

a lower electrode layer; and a piezoelectric film containing a perovskite-type oxide as a main component, wherein the piezoelectric film is a single unitary piezoelectric film material layer, and has an oxygen-deficient region in a region in contact with the lower electrode layer, when three regions in a thickness direction of the piezoelectric film, each having ⅓ thickness of the piezoelectric film, are defined as a first region, a second region and a third region in the order from a side of the lower electrode layer, an average value of oxygen amounts in the second region is defined as a first average oxygen amount, and an average value of oxygen amounts in the oxygen-deficient region is defined as a second average oxygen amount, a ratio R of the second average oxygen amount to the first average oxygen amount is less than 0.97, and a thickness of the oxygen-deficient region is 120 nm or more and is ⅓ or less of a thickness of the entire piezoelectric film.

2. The piezoelectric laminate according to claim 1, wherein the ratio R is 0.91 or more and 0.95 or less.

3. The piezoelectric laminate according to claim 1, wherein the thickness of the oxygen-deficient region is 150 nm or more and is ¼ or less of the thickness of the entire piezoelectric film.

4. The piezoelectric laminate according to claim 1, wherein the piezoelectric film is a uniaxial alignment film aligned in a (100) direction.

5. The piezoelectric laminate according to claim 4, wherein a polarization direction of the piezoelectric film is a direction from a side of the lower electrode layer toward a film surface of the piezoelectric film.

6. The piezoelectric laminate according to claim 1, wherein the perovskite-type oxide contains Pb, Zr, Ti, and O.

7. The piezoelectric laminate according to claim 6, wherein when the perovskite-type oxide is represented by $ABO_3$, in which A represents A-site element, B represents B-site element and O represents an oxygen element, the perovskite-type oxide contains one or more elements selected from V, Nb, Ta, Sb, Mo, and W in the B site.

8. The piezoelectric laminate according to claim 1, wherein the lower electrode layer in contact with the piezoelectric film is an Ir layer aligned on a (111) plane.

9. A piezoelectric element comprising:

the piezoelectric laminate according to claim 1; and an upper electrode layer provided on the piezoelectric film of the piezoelectric laminate.

* * * * *